(12) United States Patent
Kikuchi

(10) Patent No.: US 6,553,213 B1
(45) Date of Patent: Apr. 22, 2003

(54) TRANSMITTER OUTPUT POWER DETECTING CIRCUIT

(75) Inventor: Jiro Kikuchi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 239 days.

(21) Appl. No.: 09/644,180

(22) Filed: Aug. 22, 2000

(30) Foreign Application Priority Data

Sep. 7, 1999 (JP) .......................................... 11-253458

(51) Int. Cl.[7] .................................................. H04B 1/04
(52) U.S. Cl. ........................ 455/127; 455/115; 455/117; 455/126; 330/129
(58) Field of Search ............................... 455/67.1, 67.3, 455/67.4, 95, 115, 117, 126, 127, 522, 575; 330/252, 254, 256, 289, 298, 129, 130, 131

(56) References Cited

U.S. PATENT DOCUMENTS

| 3,866,136 | A | * | 2/1975 | Augustin et al. | ............ 455/127 |
| 5,369,789 | A | * | 11/1994 | Kosugi et al. | ............... 455/126 |
| 5,396,652 | A | * | 3/1995 | Kunitomo | .................... 455/126 |
| 5,697,074 | A | | 12/1997 | Makikallio et al. | ......... 455/126 |
| 5,732,334 | A | * | 3/1998 | Miyake | ...................... 455/127 |
| 6,275,684 | B1 | * | 8/2001 | Kaneko et al. | ............. 455/115 |

FOREIGN PATENT DOCUMENTS

| JP | 6-177684 | 6/1994 |
| JP | 7-249942 | 9/1995 |

* cited by examiner

Primary Examiner—Quochien Vuong
(74) Attorney, Agent, or Firm—Beyer Weaver & Thomas

(57) ABSTRACT

An output power detecting circuit of transmitter, comprises a signal detecting unit connected between the transmitter output end and the transmitter control unit to detect an output signal of transmitter, a reference voltage generating unit, a differential amplifier having non-inverted input end, inverted input end and output end to supply a detection voltage to the control unit from the output end and a voltage limiting element connected between the inverted input end and reference potential point, wherein the detection voltage output from the signal detecting unit is supplied to the non-inverted input end, the reference voltage output from the reference voltage generating unit and an additional reference voltage of the transmitting level indicating voltage output from the control unit are respectively supplied to the inverted input end, the additional reference voltage supplied to the inverted input end is limited with the voltage limiting element and the detection voltage increasing with increase of the detection voltage is kept within the dynamic range for gain control of the control unit.

3 Claims, 3 Drawing Sheets

TRANSMITTER OUTPUT POWER DETECTING CIRCUIT

BACKGROUND OF THE INVENTION

1. Field of the Invention

The present invention relates to an output power detecting circuit of transmitter and particularly to an output power detecting circuit of transmitter which restrains, when an output signal level of a transmitter increases, a detected voltage output from an output power detecting circuit from increasing exponentially and from exceeding the dynamic range of a control unit.

2. Description of the Related Art

In general, a mobile communication system such as a hand-held telephone system or the like realizes communications between a base station installed at the fixed area and mobile stations respectively provided at moving vehicles or the like. In this case, since distance between the base station and mobile station in which the communication is established changes from time to time, the level of transmitting signal which is transmitted from the mobile station and is received to the base station, namely the field intensity of the receiving radio-wave at the base station changes to a large extent depending on the position of the mobile station at the time of communication and the normal communication is disabled in some cases between the base station and mobile station depending on the position of the mobile station. In view of avoiding such phenomenon, in the mobile communication system such as hand-held telephone system, the base station monitors the signal level transmitted from the mobile station at the time of communication between the base station and mobile station. When such signal level is lower or higher than the normal level range, the base station transmits a transmitting level instruction (TX-AGC) signal (hereinafter, referred to as TX-AGC signal) in the constant period, for example, in every period of 1.25 ms to the mobile station in order to indicate increase or decrease of the transmitting signal level. Upon reception of the TX-AGC signal, the mobile station increases or decreases the transmitting signal level depending on the content of instruction of TX-AGC signal in order to realize normal communication between the base station and mobile station.

Here, FIG. 2 is a block diagram illustrating an example of structure of the mobile station used in the mobile communication system of the related art.

As illustrated in FIG. 2, a mobile station is composed of a signal transmitting system 20T, a signal receiving system 20R and a transceiver system 20C. In this case, the signal transmitting system 20T comprises an isolator 22, a power amplifier (PA) 23, a drive amplifier (DA) 24, a signal mixer (MIX) 25, a TX-AGC amplifier (TX-AGC AMP) 26, a modulator (MOD) 27, a digital-analog converter (D/A) 28 and an output power detecting circuit 29 and these structural elements 22 to 29 are connected as illustrated in FIG. 2. The signal receiving system 20R comprises a low noise amplifier (LNA) 30, a signal mixer (MIX) 31, a band-pass filter (BF) 32, an RX-AGC amplifier (RX-AGC AMP) 33, a demodulator (DEM) 34, a low-pass filter (LF) 35 and a digital-analog converter (D/A) 36 and these structural elements 30 to 36 are connected as illustrated in FIG. 2. Moreover, the transceiver system 20C comprises a duplexer 21, a control unit (CPU) 37 and a transmitting/ receiving antenna 38 and these structural elements 21, 37, 38 are connected as illustrated in FIG. 2.

The mobile station used in the mobile communication system of the related art comprising the structural elements explained above almost operates as explained below.

In the case where communication is performed between a mobile station and the base station, the transmitting signal from the mobile station is formed as the transmitting base-band signal in the control unit 37 and this base-band signal is supplied to a modulator 27 and is then converted to the modulation signal in the frequency higher than the base-band signal. The modulation signal obtained is amplified in the TX-AGC amplifier 25 to be the signal level depending on the TX-AGC signal supplied from the control unit 37 through the digital/analog converter 28 and is then mixed in the frequency with a local oscillation signal in the signal mixer 25 and is converted to a high frequency signal. This high frequency signal is amplified up to the predetermined level in the drive amplifier 24 and is then amplified up to the level suitable for the transmitting signal in the power amplifier 23. The amplified high frequency signal is supplied as the transmitting signal to the duplexer 21 via the isolator 22 and is then supplied to the transmitting/receiving antenna 38 from the duplexer and finally transmitted as the radio-wave signal from the antenna 38.

Meanwhile, the receiving signal in the mobile station is supplied, when the radio-wave signal transmitted from the base station is received by the transmitting/receiving antenna 38, to the duplexer 21 and it is then supplied to the low noise amplifier 30 from the duplexer 21 and then amplified to have the predetermined signal level. The amplified receiving signal is mixed in the signal mixer 31 with the local oscillating signal to become the frequency-mixed signal. Thereafter, the frequency-mixed signal is then supplied to the band-pass filter 32 and only the intermediate frequency signal is extracted from the frequency-mixed signal. The extracted intermediate frequency signal is amplified up to the predetermined level in the RX-AGC amplifier 38 and the amplified intermediate frequency signal is supplied to the demodulator 34 to be demodulated into the base-band signal to become the receiving base-band signal. The receiving base-band signal obtained is supplied to the control unit 37 through elimination of unwanted frequency element in the low-pass filter 35 and is then supplied to an application circuit not illustrated from the control unit 37.

At the time of starting the communication between the mobile station and base station, the TX-AGC signal is supplied to the mobile station from the base station in the constant period, for instance, in every period of 1.25 ms to designate the signal level to be transmitted from the mobile station. The mobile station supplies, upon reception of the TX-AGC signal transmitted thereto with the transmitting/receiving antenna 38, this TX-AGC signal to the control unit 37 through the signal receiving system 20R like the receiving signal. The control unit 37 generates a digital TX-AGC signal depending on the supplied TX-AGC signal and the detected voltage from the output power detecting circuit 29. This digital TX-AGC signal is then supplied to the digital-analog converter 28 for the digital-analog conversion, the analog gain control voltage obtained is supplied to the TX-AGC amplifier 26, thereby signal gain of the TX-AGC amplifier 26 is set to the value determined by the analog gain control voltage, namely to the value instructed with the TX-AGC signal.

Moreover, a part of the transmitting signal obtained at the output of the power amplifier 3 is supplied to the output power detecting circuit 29. The output power detecting circuit 29 detects the transmitting signal supplied to form a detection voltage corresponding to the transmitting signal and compares this detection voltage with the reference voltage to generate the detection voltage indicating the result of comparison and then supplies the detection voltage to the control unit 37. The control unit 37 arithmetically processes the detection voltage supplied to generate the digital TX-AGC signal in order to control the gain of the TX-AGC amplifier 26. This digital TX-AGC signal is supplied to the TX-AGC amplifier 26 via the digital-analog converter 28. Thereby the gain of the TX-AGC amplifier 26 is controlled as explained above.

Moreover, the control unit 37 arithmetically processes the receiving base-band signal level to generate the digital RX-AGC signal for controlling the gain of the RX-AGC amplifier 33. This digital RX-AGC signal is supplied to the digital-analog converter 36 for the digital-analog conversion and is then supplied to the RX-AGC amplifier 33 as the analog RX-AGC signal in view of adjusting the signal gain of the RX-AGC amplifier 33 to the adequate level.

Next, FIG. 3 is a circuit diagram illustrating an example of structure of the output power detecting circuit 29 used in the mobile station of the related art illustrated in FIG. 2.

As illustrated in FIG. 3, this output power detecting circuit 29 comprises a signal detecting unit 37, a reference voltage generating unit 38, a voltage comparing unit 39, a signal input terminal 40 and a detecting voltage output terminal 41. In this case, the signal detecting unit 37 is composed of a coupling capacitor $37_1$, a first diode $37_2$, a second diode $37_3$, a bypass capacitor $37_4$, a shunt capacitor $37_5$, a first series resistor $37_6$ and a first shunt resistor $37_7$ and each structural element $37_1$ to $37_7$ is connected as illustrated in FIG. 3. The reference voltage generating unit 38 is composed of a third diode $38_1$, a fourth diode $38_2$, a buffer resistor $38_3$, a DC power source $38_4$, a second series resistor $38_5$ and a second shunt resistor $38_6$ and each structural element $38_1$ to $38_6$ is connected as illustrated in FIG. 3. Moreover, the voltage comparing unit 39 is composed of a differential amplifier $39_1$ and a logarithmic amplifier $39_2$ and the entire part is formed of the exclusive integrated circuit. Each structural element $39_1$ to $39_2$ is connected as illustrated in FIG. 3.

The output power detecting circuit 29 of the structure explained above almost operates as explained below.

When the transmitting signal obtained at the output of power amplifier 23 is supplied to the signal input terminal 40, this transmitting signal passes the coupling capacitor $37_1$ and is then detected with the detecting circuit consisting of the first diode $37_2$, second diode $37_3$ and bypass capacitor $37_4$ and is then converted to the detection signal. This detection signal is smoothed with the shunt capacitor $37_5$ and thereafter it is divided in voltage with the circuit consisting of the first series resistor $37_6$ and first shunt resistor $37_7$ and is then supplied as the detection voltage to the non-inverted input terminal (+) of the differential amplifier $39_1$. Moreover, a DC voltage output from the DC power supply $38_4$ passes through the series connection circuit of the buffer resistor $38_3$, third diode 381 and fourth diode $38_2$, thereafter divided in voltage with the circuit consisting of the second series resistor $38_5$ and the second shunt resistor $38_6$ and is then supplied as the reference voltage to the inverted input terminal (−) of the differential amplifier $39_1$. The differential amplifier $39_1$ compares the detection voltage with the reference voltage to generate a comparison voltage which is equal to the voltage difference of such voltages and then supplies the comparison voltage to the logarithmic amplifier $39_2$. The logarithmic amplifier $39_2$ amplifies the comparison voltage supplied and then supplies the amplified output to the detection voltage output terminal 41 as the detection voltage.

In this output power detecting circuit 29, the logarithmic amplifier $39_2$ is used as the voltage comparing unit 39. Here, if only a differential amplifier $39_1$ is used as the voltage comparing unit 39, an increasing rate of the detection voltage increases in the form of exponential function for the transmitting signal for the sequential increase of the transmitting signal in the unit of decibel. Therefore, when the transmitting signal reaches a certain level, the detection voltage supplied to the control unit 36 becomes too large and it exceeds the dynamic range for gain control in the control unit 36. Meanwhile, when the differential amplifier $39_1$ and logarithmic amplifier $39_2$ are used for the voltage comparing unit 39, since it is controlled in the logarithmic amplifier $39_2$ that the increasing rate of the detection voltage increases in the form of the exponential function for the transmitting signal, the area in which the detection voltage and transmitting signal change through almost linear correspondence can be widened, namely the gain control dynamic range in the control unit 36 can be widened.

Moreover, in the output power detecting circuit 29, a temperature compensating unit consisting of the third diode $38_1$ and the fourth diode $38_2$ is provided in the reference voltage generating unit 38 and thereby the temperature characteristic of the DC voltage output from the temperature compensating unit is set almost equal to the temperature characteristic of the detection signal output from the detecting circuit unit including the first diode $37_2$ and second diode $37_3$. Accordingly, each temperature characteristic of the detection signal and DC voltage is canceled at the time of voltage comparison in the differential amplifier $39_1$ and thereby the comparison voltage having no temperature characteristic can be obtained at the output of the differential amplifier $39_1$ and the detection voltage having no temperature characteristic can be output from the detection voltage output terminal 41.

The output voltage detecting circuit 29 of the related art uses the differential amplifier $39_1$ and logarithmic amplifier $39_2$ in the voltage comparing unit 39 to widen the area where the detection voltage and transmitting signal change through almost linear correspondence and can attain the wide dynamic range for gain control in the control unit 36, but cannot use a general purpose integrated circuit when the voltage comparing unit 39 is formed of the differential amplifier $39_1$ and logarithmic amplifier $39_2$. As a result, an exclusive integrated circuit must be used. Accordingly, the exclusive integrated circuit forming the voltage comparing unit 39 increases in size and higher cost is required to attain the exclusive integrated circuit. Therefore, manufacturing cost of the output power detecting circuit rises and total structure also increases in size.

OBJECT AND SUMMARY OF THE INVENTION

The present invention has been proposed considering the background explained above and it is therefore an object of the present invention to provide an output power detecting circuit of the transmitter which can provide linear relationship between the detection voltage and transmitting signal and also attains the wide dynamic range for gain control in the control unit without use of exclusive integrated circuit of a large size.

In order to attain the object explained above, the output power detecting circuit of transmitter of the present invention comprises a signal detecting unit connected between the transmitter output end and the transmitter control unit to detect an output signal of transmitter, a reference voltage generating unit, a differential amplifier having non-inverted input end, inverted input end and output end to supply a detection voltage to the control unit from the output end and a voltage limiting element connected between the inverted input end and reference potential point, wherein the detection voltage output from the signal detecting unit is supplied to the non-inverted input end, the reference voltage output from the reference voltage generating unit and an additional reference voltage of the transmitting level instructing voltage output from the control unit are respectively supplied to the inverted input end, the additional reference voltage supplied to the inverted input end is limited with the voltage limiting element and the detection voltage increasing with increase of the detection voltage is kept within the dynamic range for gain control of the control unit.

In an example of the structure explained above, the voltage limiting element is formed of a zener diode.

Moreover, in the other example of the structure explained above, the reference voltage generating unit includes a temperature compensating circuit and cancels the temperature characteristic of the detection voltage output from the signal detecting unit with the reference voltage having the temperature characteristic output from the temperature compensating circuit.

According to the output power detecting circuit of transmitter providing these structures explained above, the additional reference voltage adding the reference voltage and transmitting level indicating voltage is applied to the inverted input end of the differential amplifier to shift the reference voltage, increase of detection voltage indicated by exponential function due to the increase of transmitting signal is controlled with the additional reference voltage having added the transmitting level indicating voltage to provide almost linear relationship between the transmitting signal and detection voltage, moreover a voltage limiting element, for example, a zener diode is connected between the inverted input end and the reference potential point, and further increase of the additional reference voltage when the transmitting signal is saturated is limited with this zener diode. Thereby, drop of the detection voltage due to further increase of the additional reference voltage when the transmitting signal is saturated can be prevented. As a result, it is now possible to attain the low price and small-size output power detecting circuit of transmitter in which the increasing rate of the transmitting signal and increasing rate of the detection voltage can be set to almost linear rate without use of the logarithmic amplifier and a wider dynamic range for gain control can be obtained in the control unit.

DETAILED DESCRIPTION OF THE PREFERRED EMBODIMENT

The preferred embodiment of the present invention will be explained in detail with reference to the accompanying drawings.

Figure 1:
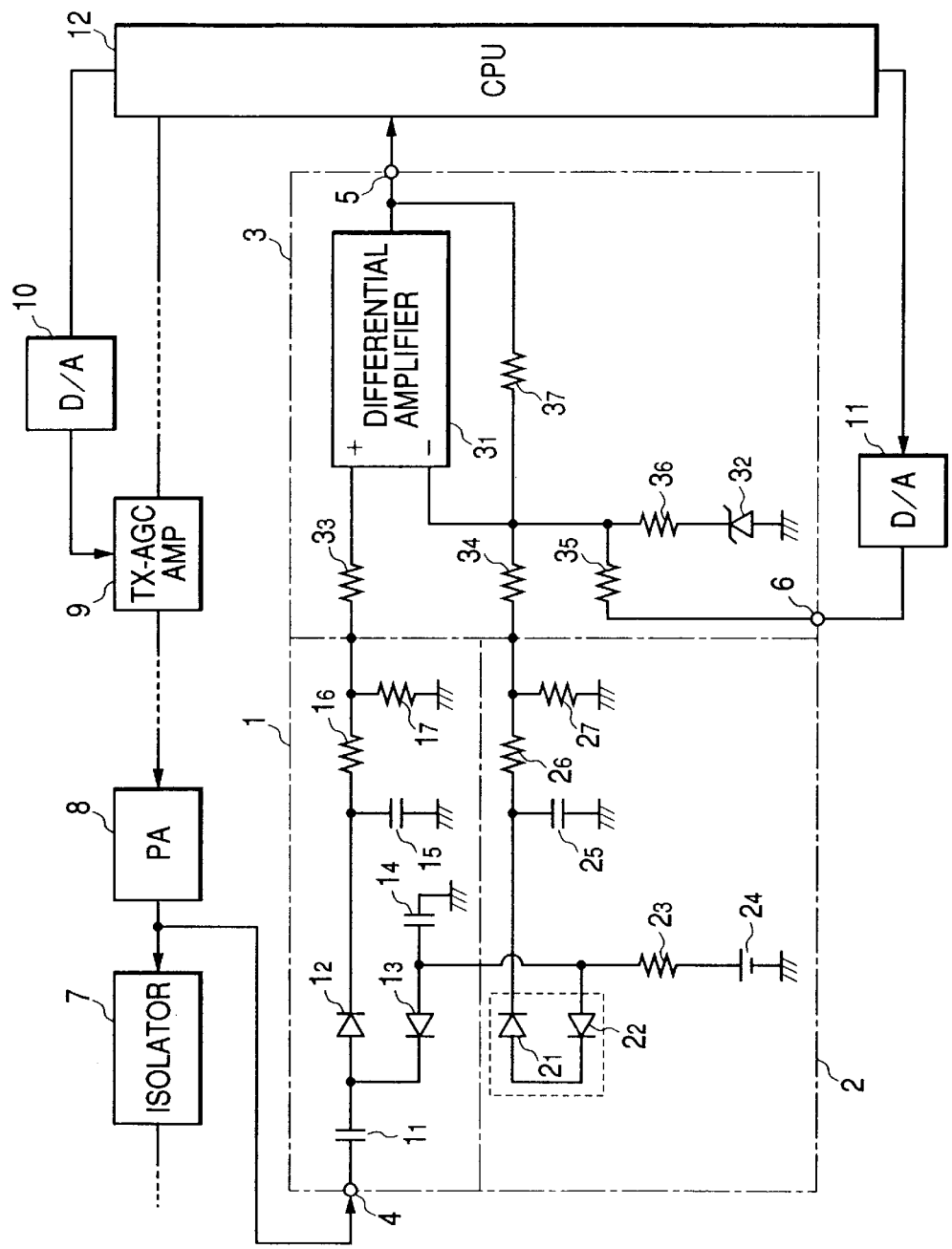
FIG. 1 is a circuit structure diagram illustrating an embodiment of the output power detecting circuit of transmitter of the present invention.
Figure 2:
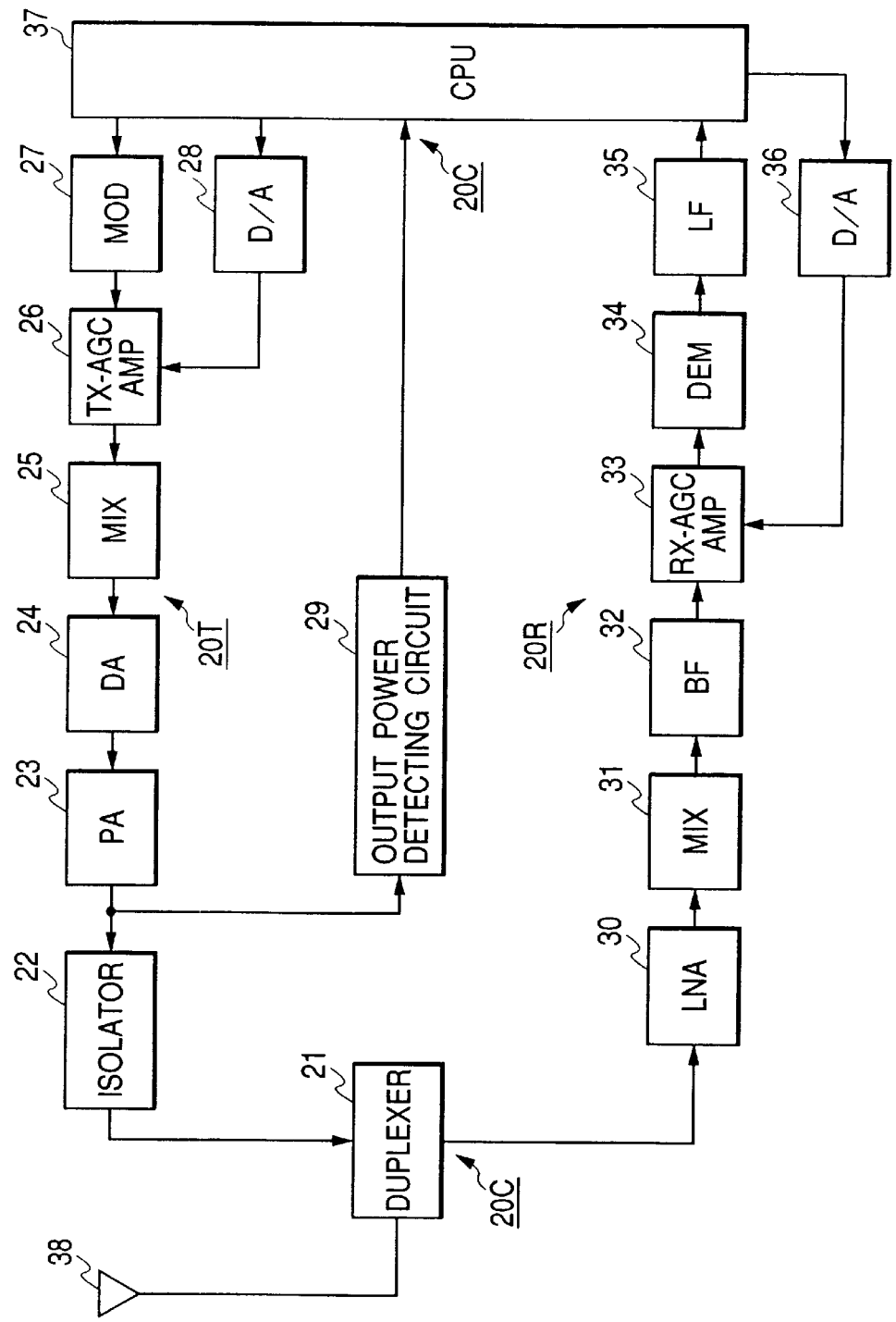
FIG. 2 is a block diagram illustrating an example of structure of a mobile station used in the mobile communication system of the related art.
Figure 3:
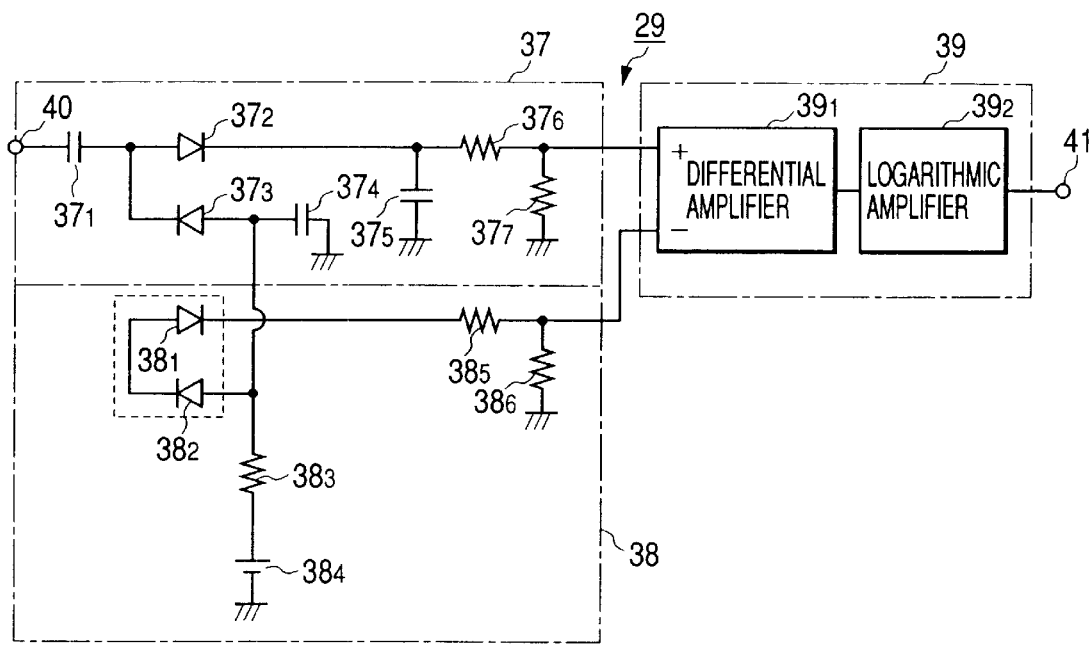
FIG. 3 is a circuit diagram illustrating an example of structure of the output power detecting circuit used in the mobile station of the related art illustrated in FIG. 2.

FIG. 1 is a circuit structure diagram illustrating a preferred embodiment of the output power detecting circuit of transmitter of the present invention.

As illustrated in FIG. 1, the output power detecting circuit of transistor of this embodiment is composed of a signal detecting unit 1, a reference voltage generating unit 2, a voltage comparing unit 3, a transmitting signal input terminal 4, a detecting voltage output terminal 5 and a transmitting level indicating (TX-AGC) voltage input terminal 6.

The signal detecting unit 1 comprises a coupling capacitor $1_1$, a first diode $1_2$, a second diode $1_3$, a bypass capacitor $1_4$, a first shunt capacitor $1_5$, a first series resistor $1_6$ and a first shunt resistor $1_7$ and these structural elements $1_1$ to $1_7$ are connected as illustrated in FIG. 1. The reference voltage generating unit 2 comprises a third diode $2_1$, a fourth diode $2_2$, a first buffer resistor $2_3$, a DC power source $2_4$, a second shunt capacitor $2_5$, a second series resistor $2_6$ and a second shunt resistor $2_7$ and the series connecting circuit of the third diode $2_1$ and fourth diode $2_2$ forms a temperature compensating unit and these structural elements $2_1$ to $2_7$ are connected as illustrated in FIG. 1. Moreover, the voltage comparing unit 3 comprises a differential amplifier $3_1$, a zener diode(voltage limiting element) $3_2$, a first input resistor $3_3$, a second input resistor $3_4$, a third input resistor $3_5$, a second buffer resistor $3_6$ and a feedback resistor $3_7$ and these structural elements $3_1$ to $3_7$ are connected as illustrated in FIG. 1.

In addition, the transmitting signal input terminal 4 is connected between the output terminal of a power amplifier (PA) 8 and the input terminal of an isolator 7 forming the signal transmitting system 3 of transmitter, the detection voltage output terminal 5 is connected to a control input end $12_1$ of a control unit (CPU) 12, and the transmitting level indication voltage input terminal 6 is connected to a second control output end $12_3$ of the control unit 12 through a second digital-analog converter (D/A) 11. A first control output end $12_2$ of the control unit 12 is connected to the gain control end (not designated with the reference numeral) of a TX-AGC amplifier (TX-AGC AMP) 9 through a first digital-analog converter (D/A) 10.

The output power detecting circuit of transmitter of this embodiment in the structure explained above operates as explained below.

When the transmitting signal obtained at the output end of the power amplifier is supplied to the transmitting signal input terminal 4, this transmitting signal passes the coupling capacitor $1_1$ and is then supplied to the detecting circuit consisting of the first diode $1_2$, second diode $1_3$ and bypass capacitor $1_4$ and the signal is then detected and converted to the detection signal. This detection signal is then smoothed by the first shunt capacitor $1_5$ through elimination of unwanted signal element and is then divided in voltage by the circuit consisting of the first series resistor $1_6$ and first shunt resistor $1_7$ and it is then supplied, as the detection voltage, to the non-inverted input end (+) of the differential amplifier $3_1$ via the first input resistor $3_3$. Moreover, the DC voltage output from the power source $2_4$ passes the series connecting circuit consisting of the buffer resistor $2_3$, third diode $2_1$ and fourth diode $2_2$. After elimination of the unwanted signal element with the second shunt capacitor $2_3$, the signal is divided in voltage in the circuit consisting of the second series resistor $2_6$ and second shunt resistor $2_7$ and is then supplied, as the DC voltage, to the inverted input end (−) of the differential amplifier $3_1$ via the second input resistor $3_4$. Simultaneously, when the TX-AGC voltage obtained at the output end of the second analog-digital converter 11 is supplied to the transmitting level indicating voltage input terminal 6, this TX-AGC voltage is supplied to the inverted input end (−) of the differential amplifier $3_1$ via the third input resistor $3_5$ and the additional reference voltage adding the DC voltage and TX-AGC voltage is supplied to the inverted input end (−) of the differential amplifier $3_1$.

The differential amplifier $3_1$ compares the detection voltage supplied to the non-inverted input end (+) and the additional reference voltage supplied to the inverted input end (−) and generates, at the output end, the detection (comparison) voltage which is equal to the voltage difference of the detection voltage and additional reference voltage. This detection voltage is then supplied to the control input end $12_1$ of the control unit 12 via the detection voltage output terminal 5. The control unit 12 calculates the detection voltage supplied and generates a digital transmitting level indicating voltage corresponding to the transmitting level indicating voltage supplied on the basis of the result of calculation. The digital transmitting level indicating voltage obtained is supplied to the gain control end of the TX-AGC amplifier 9 through the first digital-analog converter (D/A) 10 from the first control output end $12_2$ in order to control the signal gain of the TX-AGC amplifier 9.

The additional reference voltage supplied to the inverted input end (−) of the differential amplifier $3_1$ is controlled, by the zener diode $3_2$ connected between the inverted input end (−) and the ground point, not to exceed the zener voltage Vt. In this case, the zener voltage Vt is selected to become almost equal to the TX-AGC voltage in such a condition that when TX-AGC voltage further increases, the transmitting signal output from the power amplifier 8 is saturated.

Figure 4:
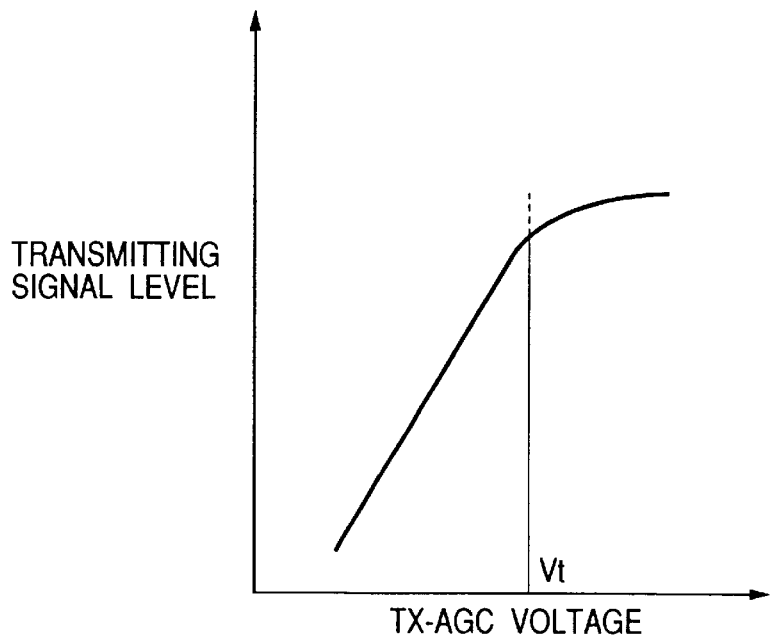
FIG. 4 is a characteristic diagram indicating the relationship between the transmitting signal and TX-AGC voltage in the output power detecting circuit of transmitter illustrated in FIG. 1.

Here, FIG. 4 is a characteristic diagram indicating the relationship between the TX-AGC voltage supplied to the transmitting level indicating voltage input terminal 6 and the transmitting signal output from the power amplifier 8 in the output power detecting circuit of transmitter illustrated in FIG. 1.

As illustrated in the characteristic diagram of FIG. 4, the output power detecting circuit of transmitter of this embodiment holds the additional reference voltage supplied to the inverted input end (−) of the differential amplifier $3_1$ to a constant voltage value specified by the zener voltage Vt even if the TX-AGC voltage increases exceeding the zener voltage Vt of the zener diode $3_2$. Therefore, if the TX-AGC voltage further increases after the transmitting signal is saturated, namely the detection voltage is saturated, the detection voltage output from the output end of the differential amplifier $3_1$ becomes almost constant and the detection voltage output is never decreased even if the TX-AGC voltage further increases. Thereby the dynamic range for gain control of the control unit 12 can substantially be widened.

Moreover, the output power detecting circuit of transmitter of this embodiment provides, in the reference voltage generating unit 2, the temperature compensating unit consisting of the third diode $2_1$ and the fourth diode $2_2$ including the circuit connection same as the circuit connection of the first diode $1_2$ and second diode $1_3$ in the signal detecting unit 1 and the DC voltage output from this temperature compensating unit is given the temperature characteristic which is almost identical to that of the detection voltage output from the signal detecting unit 1. Therefore, such temperature characteristics are canceled when the detection voltage is compared and amplified with the DC voltage in the differential amplifier 3and the detection (comparison) voltage output from the differential amplifier $3_1$ does not have such temperature characteristic and simultaneously the amplifying characteristic of the TX-AGC amplifier 9 also does not have such temperature characteristic.

As explained above, according to the output power detecting circuit of transmitter of this embodiment, it is possible to prevent such an event that the detection voltage drops due to the further increase of the additional reference voltage when the transmitting signal is saturated. As a result, it is possible to attain the low price and small size output power detecting circuit of transmitter in which the increasing rate of the transmitting signal and the detection voltage can be set as the almost linear rate without use of the logarithmic amplifier and the wide dynamic range for gain control can be assured in the control unit 12.

In this embodiment, in addition, an example where the transmitting level indicating voltage is supplied to the transmitting level indicating voltage input terminal 6 via the digital-analog converter 11 has been explained, but the output power detecting circuit of transmitter of the present invention is not limited thereto and is capable of supplying the voltage attained in the digital-analog converter 10 to the transmitting level indicating voltage input terminal 6 as the transmitting level indicating voltage. According to such structure, the digital-analog converter 11 is no longer required and the circuit configuration is a little simplified and the number of structural elements can also be reduced.

Moreover, in above embodiment, an example where a zener diode $3_2$ is used as the voltage limiting element has been explained but the output power detecting circuit of transmitter of the present invention is not limited only to the zener diode $3_2$ used as the voltage limiting element and it is also possible to introduce the structure which substantially executes the voltage limiting function similar to the function of zener diode. For example, it is also possible to eliminate the zener diode $3_2$ and resistor $3_6$ and use the operation program, in place of such elements, to operate the control unit 12 in such a manner that the transmitting level indicating voltage supplied to the inverted input terminal of the differential amplifier $3_1$ via the digital-analog converter 11 is set to the voltage having the same characteristic as the zener diode $3_2$.

What is claimed is:

1. An output power detecting circuit of transmitter comprising: a signal detecting unit connected between a transmitter output end and a transmitter control unit to detect an output signal of transmitter; a reference voltage generating unit; a differential amplifier having non-inverted input end, inverted input end and output end to supply a second detection voltage to the control unit from the output end; and a voltage limiting element connected between the inverted input end and a reference potential point, wherein a first detection voltage output from the signal detecting unit is supplied to the non-inverted input end, a reference voltage output from the reference voltage generating unit and an additional reference voltage of the transmitting level indicating voltage output from the control unit are respectively supplied to the inverted input end, the additional reference voltage supplied to the inverted input end is limited with the voltage limiting element and the second detection voltage increasing with increase of the first detection voltage is kept within the dynamic range for gain control of the control unit.

2. An output voltage detecting circuit of transmitter as claimed in claim 1, wherein the voltage limiting element is a zener diode.

3. An output voltage detecting circuit of transmitter as claimed in claim 1, wherein the reference voltage generating unit includes a temperature compensating unit and temperature characteristic of the first detection voltage output from the signal detecting unit is canceled with the reference voltage having the temperature characteristic output from the temperature compensating circuit.

* * * * *